(12) United States Patent
Lin et al.

(10) Patent No.: US 9,984,975 B2
(45) Date of Patent: May 29, 2018

(54) BARRIER STRUCTURE FOR COPPER INTERCONNECT

(71) Applicant: Taiwan Semiconductor Manufacturing Company, Ltd., Hsin-Chu (TW)

(72) Inventors: Yu-Hung Lin, Taichung (TW); Ching-Fu Yeh, Hsin-Chu (TW); Yu-Min Chang, Hsin-Chu (TW); You-Hua Chou, Hsin-Chu (TW); Chih-Wei Chang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days. days.

(21) Appl. No.: 14/212,890

(22) Filed: Mar. 14, 2014

(65) Prior Publication Data

US 2015/0262938 A1 Sep. 17, 2015

(51) Int. Cl.
*H01L 21/4763* (2006.01)
*H01L 23/532* (2006.01)
(Continued)

(52) U.S. Cl.
CPC .. *H01L 23/53238* (2013.01); *H01L 21/76843* (2013.01); *H01L 21/76855* (2013.01); *H01L 21/76873* (2013.01); *H01L 23/5226* (2013.01); *H01L 23/53233* (2013.01); *H01L 23/53295* (2013.01); *H01L 21/76831* (2013.01); *H01L 21/76846* (2013.01); *H01L 21/76858* (2013.01); *H01L 21/76864* (2013.01);
(Continued)

(58) Field of Classification Search
CPC ......... H01L 2924/0002; H01L 2924/00; H01L 21/76846; H01L 21/76831; H01L 23/53238; H01L 21/76873; H01L 21/76843; H01L 21/76867; H01L 21/76864; H01L 21/76855; H01L 2221/1089; H01L 21/76834; H01L 21/76883; H01L 21/76858
USPC ........................................ 438/627, 643, 653
See application file for complete search history.

(56) References Cited

U.S. PATENT DOCUMENTS 6,249,055 B1 * 6/2001 Dubin ............... H01L 21/76831
257/751
6,952,052 B1 10/2005 Marathe et al.
(Continued)

FOREIGN PATENT DOCUMENTS

TW I260740 8/2006

OTHER PUBLICATIONS

Haneda, M. et al., "Growth Behavior of Self-Formed Barrier at Cu—Mn/SiO2 Interface at 250-450 oC," Applied Physics Letters, vol. 90, Jun. 5-7, 2006, pp. 155-158, IEEE.
(Continued)

*Primary Examiner* — David Chen
(74) *Attorney, Agent, or Firm* — Slater Matsil, LLP (57) ABSTRACT

A method for forming an interconnect structure includes forming a dielectric layer overlying a substrate, forming an opening in the dielectric layer, forming a metal-containing layer overlying the opening in the dielectric layer, forming a conformal protective layer overlying the metal-containing layer, filling a conductive layer in the opening, and performing a thermal process to form a metal oxide layer barrier layer underlying the metal-containing layer.

20 Claims, 4 Drawing Sheets

(51) Int. Cl.
*H01L 23/522* (2006.01)
*H01L 21/768* (2006.01)

(52) U.S. Cl.
CPC .... *H01L 21/76867* (2013.01); *H01L 23/5329* (2013.01); *H01L 2221/1089* (2013.01); *H01L 2924/0002* (2013.01)

(56) References Cited

U.S. PATENT DOCUMENTS

| | | | |
|---|---|---|---|
| 8,517,769 B1* | 8/2013 | Lin et al. ................... | 439/629 |
| 8,609,531 B1* | 12/2013 | Zhang ............... | H01L 23/53238 257/E21.582 |
| 8,722,531 B1* | 5/2014 | Lin et al. ................... | 438/627 |
| 8,742,581 B2 | 6/2014 | Yang et al. | |
| 2002/0076918 A1 | 6/2002 | Han et al. | |
| 2003/0129828 A1 | 7/2003 | Cohen | |
| 2005/0098897 A1 | 5/2005 | Edelstein et al. | |
| 2006/0199386 A1 | 9/2006 | Huang et al. | |
| 2007/0090472 A1 | 4/2007 | Hasunuma | |
| 2008/0280151 A1* | 11/2008 | Jourdan ............ | H01L 21/76831 428/450 |
| 2009/0243112 A1* | 10/2009 | Koike et al. ................ | 257/762 |
| 2009/0280641 A1 | 11/2009 | Kang et al. | |
| 2010/0099254 A1* | 4/2010 | Narushima ............ | C23C 16/44 438/668 |
| 2010/0112806 A1* | 5/2010 | Matsumoto ....... | H01L 21/28556 438/643 |
| 2010/0140802 A1* | 6/2010 | Matsumoto et al. ......... | 257/741 |
| 2010/0155951 A1 | 6/2010 | Koike et al. | |
| 2010/0200934 A1 | 8/2010 | Chen et al. | |
| 2011/0027985 A1 | 2/2011 | Tsumura et al. | |
| 2011/0034026 A1 | 2/2011 | Sunayama et al. | |
| 2011/0049705 A1 | 3/2011 | Liu et al. | |
| 2011/0101529 A1 | 5/2011 | Kao et al. | |
| 2011/0147940 A1* | 6/2011 | Akolkar ............... | H01L 21/288 257/762 |
| 2011/0256715 A1* | 10/2011 | Pan ................... | H01L 21/76831 438/653 |
| 2012/0070981 A1 | 3/2012 | Clendenning et al. | |
| 2013/0178058 A1 | 7/2013 | Edelstein et al. | |
| 2013/0244424 A1 | 9/2013 | Edelstein et al. | |
| 2014/0070283 A1 | 3/2014 | Kim et al. | |
| 2014/0117547 A1* | 5/2014 | Lin ................... | H01L 23/53233 257/751 |
| 2014/0161992 A1* | 6/2014 | Ishizaka et al. ............. | 427/576 |
| 2014/0252617 A1 | 9/2014 | Ryan et al. | |
| 2015/0110975 A1* | 4/2015 | Matsumoto ............ | C23C 16/02 427/586 |

OTHER PUBLICATIONS

Koike, J. et al., "Self-Forming Diffusion Barrier Layer in Cu—Mn Alloy Metallization," Applied Physics Letters, vol. 87, Issue 4, Jul. 2005, AIP.

Koike, J. et al., "Cu Alloy Metallization for Self-Forming Barrier Process," 2006 International Interconnect Technology Conference, Jun. 5-7, 2006, pp. 161-163.

Nogami, T. et al., "Electromigration Extendibility of Cu(Mn) Alloy-Seed Interconnects, and Understanding the Fundamentals," 2012 IEEE International Electron Devices Meeting (IEDM), Dec. 10-13, 2012, pp. 33.7.1-33.7.4.

Nogami, T. et al., "CVD Co and its Application to Cu Damascene Interconnections," 2010 International Interconnect Technology Conference (IITC), Jun. 6-9, 2010, pp. 1-3.

He, M. et al., "Mechanism of Co Liner as Enhancement Layer for Cu Interconnect Gap-Fill," Journal of the Electrochemical Society, vol. 160, Issue 12, Jun. 14, 2013, pp. D3040-D3044.

\* cited by examiner

BARRIER STRUCTURE FOR COPPER INTERCONNECT

BACKGROUND

Semiconductor devices are used in a variety of electronic applications, such as personal computers, cell phones, digital cameras, and other electronic equipment, as examples. As technology has progressed, the demand for smaller semiconductor devices with improved performance has increased. As feature densities increase, the widths of the conductive lines, and the spacing between the conductive lines of back-end of line (BEOL) interconnect structures also need to scale smaller.

A move is being made away from the traditional materials used in the past in semiconductor device designs, in order to meet these demands. To reduce the RC time delay, low dielectric constant (low-k) materials are being used as insulating materials, and there is a switch being made to the use of copper for interconnect materials, rather than aluminum. Advantages of using copper for semiconductor device interconnects include abilities to operate faster and manufacture thinner conductive lines because copper has lower resistivity and increased electromigration resistance compared to aluminum. Combining copper interconnects with low-k dielectric materials increases interconnect speed by reducing the RC time delay, for example.

Copper interconnects are often formed using damascene processes rather than by direct etching. Damascene processes are typically either single or dual damascene, which includes forming openings by patterning and etching inter-metal dielectric (IMD) layers and filling the openings with copper. Because copper diffuses easily into some dielectric materials, especially some types of low-k dielectric materials, a diffusion barrier layer is usually deposited on the inner walls of the damascene opening before the copper is formed. Refractory metals such as tantalum (Ta) or titanium (Ti), or nitride compounds of these metals are used as materials of the diffusion barrier layer. However, there are some challenges in using refractory metals in the copper damascene structure since these metallic films have high resistance, thereby causing increased resistance in the copper lines and increased RC delay, especially in small, narrow features.

As the shrinkage of copper lines has progressed in recent years, there is a trend towards thinner films being used for the diffusion barrier layer. Physical vapor deposition (PVD) process used for depositing a thinner TaN/Ta barrier layer encounters difficulties in advanced scale of interconnection. Atomic layer deposition (ALD) process is the candidate to deposit a very thin diffusion barrier layer with uniform coverage, but the ALD method is disadvantageous in extremely low deposition rate and poor throughput. In addition, in manufacturing the TaN/Ta film, a problem occurs in which favorable adhesion between diffusion barrier layer and the IMD layer cannot be achieved. For example, copper lines peel off at the interface, worsening the yield of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are intended for illustration.

Figure 1:
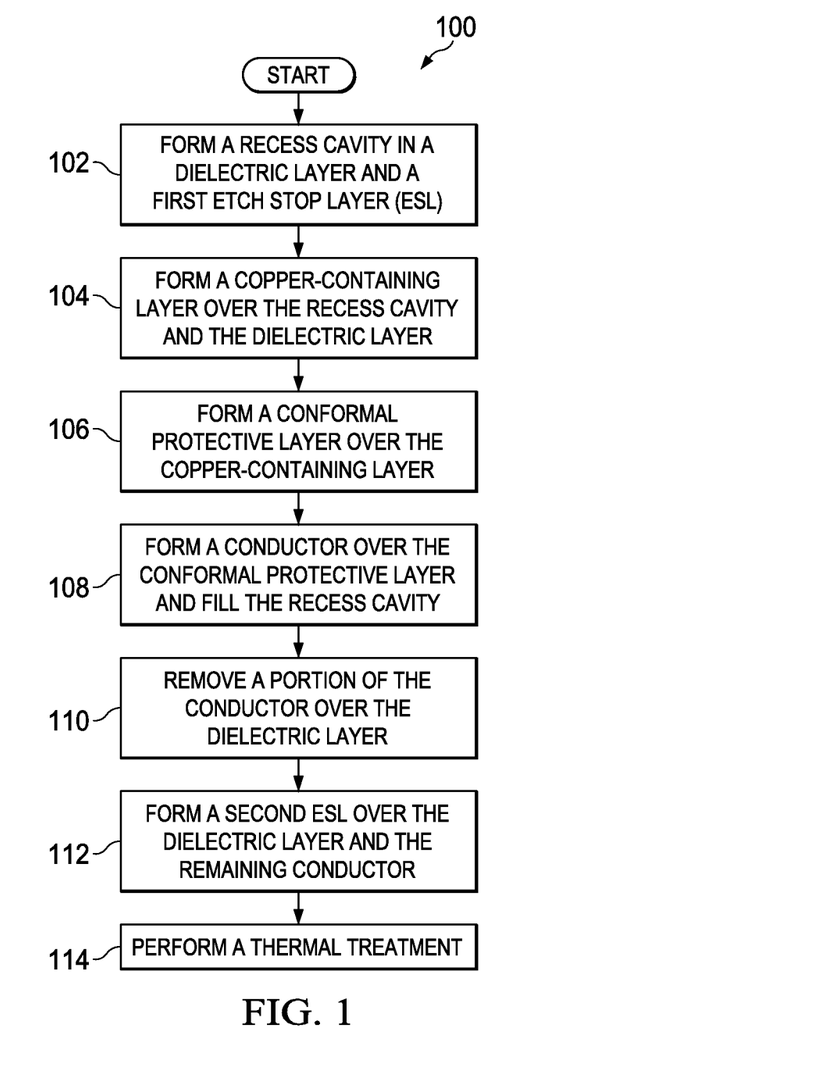
FIG. 1 is a flowchart illustrating a method for fabricating a semiconductor device comprising an interconnect according to various aspects of the present disclosure.

FIG. 1 is a flowchart illustrating a method 100 for fabricating a semiconductor device 200 according to various aspects of the present disclosure. FIGS. 2-6 show schematic cross-sectional views of a semiconductor device 200 at various stages of fabrication according to an embodiment of the method 100 of FIG. 1. The semiconductor device 200 may be included in a microprocessor, a memory cell, and/or other integrated circuit (IC). It is noted that the method of FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and/or after the method 100 of FIG. 1, and that some other processes may only be briefly described herein. Also, FIGS. 1 through 6 are simplified for a better understanding of the present disclosure. For example, although the figures illustrate the semiconductor device 200, it is understood the IC may comprise a number of other devices comprising transistors, resistors, capacitors, inductors, fuses, etc.

Figure 2:
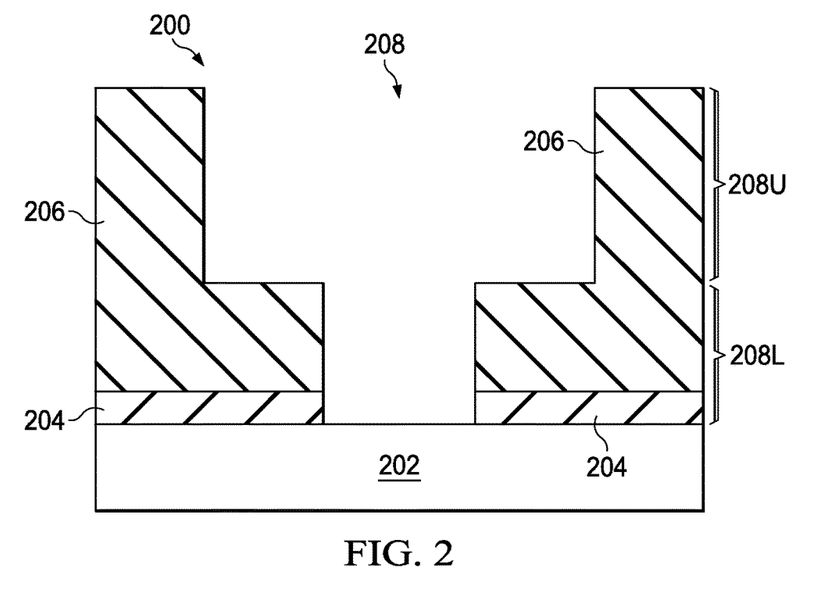
FIGS. 2-6 show schematic cross-sectional views of an interconnect structure of a semiconductor device at various stages of fabrication according to various aspects of the present disclosure.

Referring to FIGS. 1 and 2, the method 100 begins at step 102 wherein a recess cavity 208 is formed in a dielectric layer 206. In some embodiments, the dielectric layer 206 is referred to as an inter-metal dielectric (IMD) layer. In some embodiments, a first etch stop layer 204 is formed over a semiconductor substrate 202 and under the dielectric layer 206. In some embodiments, the recess cavity 208 is formed in the dielectric layer 206 and the first etch stop layer 204. The semiconductor substrate 202 is a substrate as employed in a semiconductor integrated circuit fabrication, and integrated circuits may be formed therein and/or thereupon. The term "semiconductor substrate" is defined to mean any construction comprising semiconductor material, for example, a silicon substrate with or without an epitaxial layer, a silicon-on-insulator substrate containing a buried insulator layer, or a substrate with a silicon germanium layer. The term "integrated circuits" as used herein refers to electronic circuits having multiple individual circuit elements, such as transistors, diodes, resistors, capacitors, inductors, and other active and passive semiconductor devices. A conductive region formed in and/or on the semiconductor substrate 202 is a portion of conductive routes and has exposed surfaces that may be treated by a planarization process, such as chemical mechanical polishing. Suitable materials for the conductive regions may include, but not limited to, for example copper, aluminum, copper alloy, or other mobile conductive materials. Copper interconnect level may be the first or any subsequent metal interconnect level of the semiconductor device.

In some embodiments, the first etch stop layer 204 functions for controlling the end point during subsequent etching processes. In some embodiments, the first etch stop layer 204 is formed of silicon oxide, silicon nitride, silicon carbide, silicon oxynitride or combinations thereof. In some embodiments, the first etch stop layer 204 has a thickness of about 10 angstroms to about 1000 angstroms. The first etch stop layer 204 is formed through any of a variety of deposition techniques, including LPCVD (low-pressure chemical vapor deposition), APCVD (atmospheric-pressure chemical vapor deposition), PECVD (plasma-enhanced chemical vapor deposition), PVD (physical vapor deposition), sputtering, and future-developed deposition procedures.

The dielectric layer 206 may be a single layer or a multi-layered structure. In some embodiments, the dielectric layer 206 has a thickness that varies with the applied technology, for example a thickness of about 1000 angstroms to about 30000 angstroms. In some embodiments, the dielectric layer 206 is silicon oxide, carbon-doped silicon oxide, a comparatively low dielectric constant (k value) dielectric material with a k value less than about 4.0, or combinations thereof. In some embodiments, the dielectric layer 206 is formed of a material, including low-k dielectric material, extreme low-k dielectric material, porous low-k dielectric material, and combinations thereof. The term "low-k" is intended to define a dielectric constant of a dielectric material of 3.0 or less. The term "extreme low-k (ELK)" means a dielectric constant of 2.5 or less, and preferably between 1.9 and 2.5. The term "porous low-k" refers to a dielectric constant of a dielectric material of 2.0 or less, and preferably 1.5 or less. A wide variety of low-k materials may be employed in accordance with embodiments, for example, spin-on inorganic dielectrics, spin-on organic dielectrics, porous dielectric materials, organic polymer, organic silica glass, FSG (SiOF series material), HSQ (hydrogen silsesquioxane) series material, MSQ (methyl silsesquioxane) series material, or porous organic series material. In some embodiments, the dielectric layer 206 is deposited through any of a variety of techniques, such as chemical vapor deposition (CVD), physical vapor deposition (PVD), atomic layer deposition (ALD), remote plasma enhanced chemical vapor deposition (RPECVD), liquid source misted chemical deposition (LSMCD), coating, spin-coating or another process that is adapted to form a thin film layer over the substrate.

In embodiments, the dielectric layer 206 is a nitrogen-containing layer, a carbon-containing layer, or a carbon-containing and nitrogen-containing layer for increasing corrosion resistance during a subsequent chemical mechanical polishing (CMP) process and/or increasing electromigration resistance. In one embodiment, the dielectric layer 206 is a silicon-containing and nitrogen-containing dielectric layer. In another embodiment, the dielectric layer 206 is a silicon-containing and carbon-containing dielectric layer. In another embodiment, the dielectric layer 206 is a silicon-containing, nitrogen-containing, and carbon-containing dielectric layer. In one embodiment, the dielectric layer 206 has a ratio by weight of carbon to silicon about equal or greater than 0.5. In another embodiment, the dielectric layer 206 has a ratio by weight of nitrogen to silicon about equal or greater than 0.3. In another embodiment, the dielectric layer 206 has a ratio by weight of carbon to silicon about equal or greater than 0.5 and a ratio by weight of nitrogen to silicon about equal or greater than 0.3.

The recess cavity 208 is an exemplary dual damascene opening including an upper trench section 208U and a lower via-hole section 208L patterned in the dielectric layer 206 and the first etch stop layer 204 to define a contact region on the semiconductor substrate 202. Although the embodiments illustrate dual damascene openings in the IMD layer, the use of single damascene openings in the IMD layer also provide values. In dual damascene techniques including a "via-first" patterning method or a "trench-first" patterning method, the upper trench section 208U and the lower via-hole section 208L may be formed using a typical lithographic with masking technologies and anisotropic etch operation (e.g., plasma etching or reactive ion etching). In alternative embodiments, a bottom etch stop layer (not shown), a middle etch stop layer (not shown), a polish stop layer (not shown), or an anti-reflective coating (ARC) layer (not shown) is deposited on or intermediately in the dielectric layer 206, providing a clear indicator of when to end a particular etching process.

Figure 3:
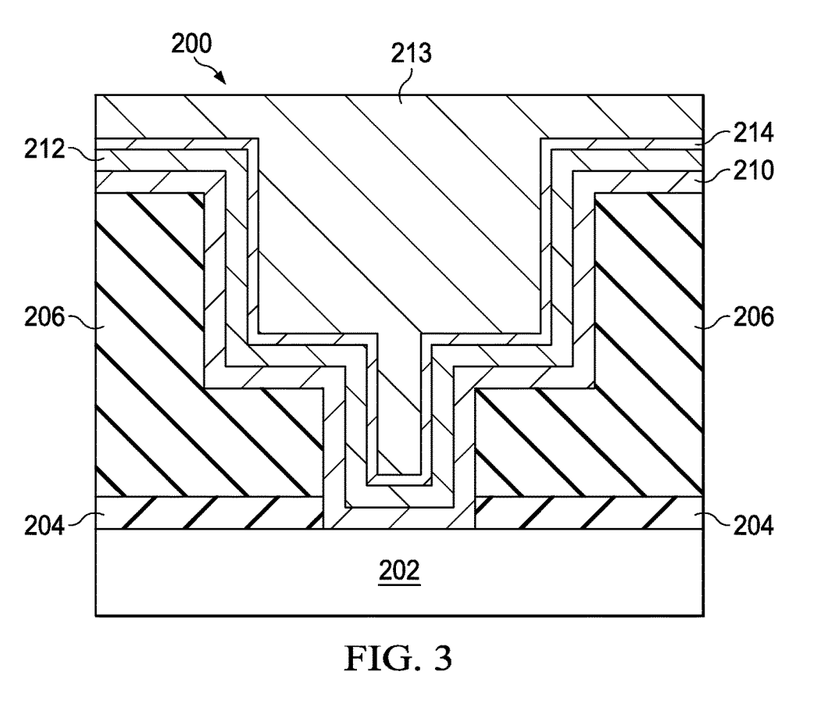

Referring to FIGS. 1 and 3, the method 100 proceeds to step 104 wherein a copper-containing layer 210 is formed on the above-described structure to line the sidewalls and bottoms of the recess cavity 208 and over the dielectric layer 206. In one embodiment, the copper-containing layer 210 is a metal alloy layer containing at least a main metal element, copper (Cu), and an additive metal element. In some embodiments, the additive metal element includes manganese (Mn), aluminum (Al), titanium (Ti), niobium (Nb), chromium (Cr), vanadium (V), yttrium (Y), technetium (Tc), rhenium (Re), or combinations thereof.

In some embodiments, the copper-containing layer 210 is copper-manganese (CuMn) layer with a crystal structure of face center cubic (FCC). In some embodiments, a ratio of manganese to copper contained in the CuMn layer ranges from about 0.02% to about 5.00%. In some embodiments, the copper-containing layer 210 has a thickness of about 20 angstroms to about 200 angstroms. In some embodiments, the copper-containing layer 210 is deposited by using physical vapor deposition (PVD), chemical vapor deposition (CVD), plasma-enhanced CVD (PECVD), low pressure CVD (LPCVD), or other well-known deposition techniques.

Still referring to FIGS. 1 and 3, the method 100 proceeds to step 106 wherein a protective layer 212 is conformally deposited over the copper-containing layer 210. The conformal protective layer 212 may function as a barrier to prevent a subsequently formed conductor from diffusing into the underlying dielectric layer 206. In some embodiments, the conformal protective layer 212 includes cobalt (Co), ruthenium (Ru) or combinations thereof and Co has a resistivity of about 62.4 nΩ-m at 20 degrees Celsius, which is lower than the resistivity of typical diffusion barrier layers including Ta, Ti, W, or TaN barrier layers. Therefore, a low resistance of the conformal protective layer 212 can be achieved to decrease a RC delay issue.

In some embodiments, the protective layer 212 is deposited conformally above the copper-containing layer 210 by using chemical vapor deposition (CVD), atomic layer deposition (ALD) or other well-known conformal deposition techniques. The protective layer 212 is conformally deposited to avoid a gap filling issue during the subsequent opening filling process. In some embodiments, the conformal protective layer 212 has a thickness of about 10 angstroms to about 50 angstroms. In some embodiments, a combined thickness of the copper-containing layer 210 and the conformal protective layer 212 is less than about 120 angstroms to prevent a gap filling issue during the subsequent opening filling process.

The method 100 of FIG. 1 proceeds to step 108 wherein a conductor 213 is formed over the conformal protective layer 212 to fill the recess cavity 208. In some embodiments, the conductor 213 is formed as an interconnect structure in the dielectric layer 206. In some embodiments, the conductor 213 is deposited by an electro-chemical plating (ECP) process. In some embodiments, the conductor 213 at least contains the main metal element, e.g., copper (Cu). In some embodiments, the conductor 213 further contains an additive metal element. In some embodiments, the conductor 213 contains an additive metal element different from the additive metal element in the copper-containing layer 210. In some embodiments, the additive metal element in the conductor 213 is tantalum, indium, tin, zinc, manganese, chromium, titanium, germanium, strontium, platinum, magnesium, aluminum or zirconium.

In some embodiments, a conductive seed layer 214 is formed before forming the conductor 213. In some embodiments, the conductive seed layer 214 contains a pure metal, such as copper. In some embodiments, the conductive seed layer 214 at least contains the main metal element, e.g., copper (Cu), as contained in the conductor 213. In some embodiments, the conductive seed layer 214 is a copper-containing layer, such as CuAl, CuMn, or the like. In some embodiments, the conductive seed layer 214 is formed by using physical vapor deposition (PVD) or other well known deposition techniques. In some embodiments, the conductive seed layer 214 has a thickness of about 100 angstroms to about 450 angstroms.

Figure 4:
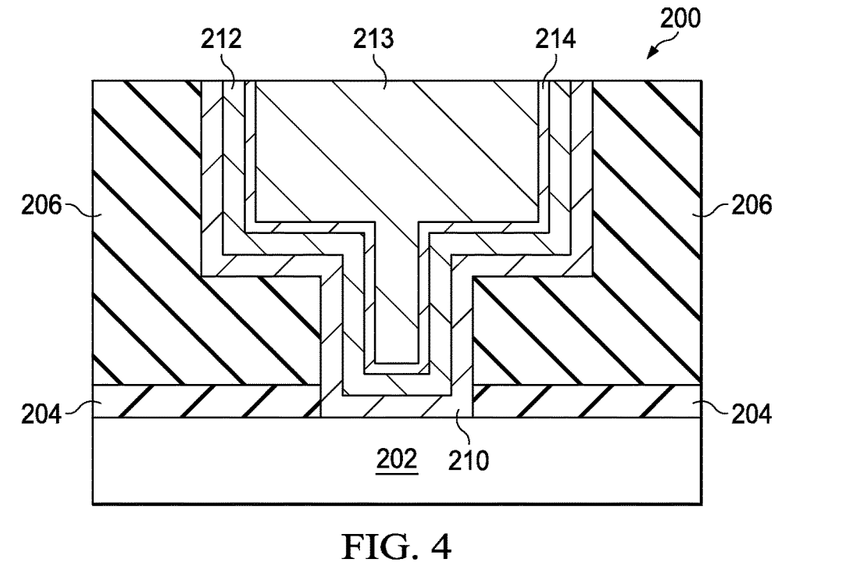

Referring to FIGS. 1 and 4, the method 100 proceeds to step 110 wherein the portion of conductor 213 over the dielectric layer 206 is removed. In some embodiments, the removing process is chemical mechanical polishing (CMP) process performed to remove the excess portions of the conductor 213, the conductive seed layer 214, the protective layer 212, and the copper-containing layer 210 outside the recess cavity 208, thus exposing the top surface of the dielectric layer 206 and achieving a planarized surface.

Figure 5:
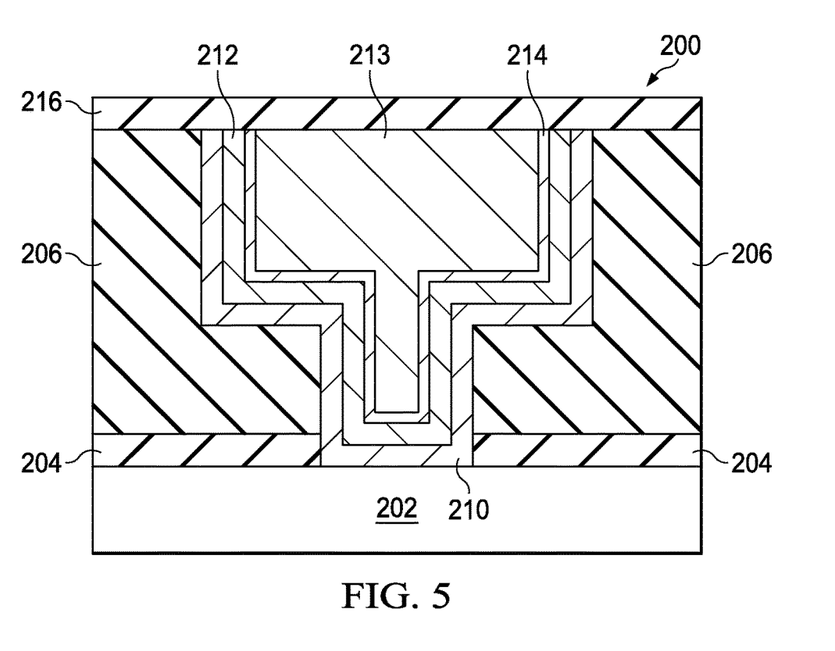

Referring to FIGS. 1 and 5, the method 100 proceeds to step 112 wherein a second etch stop layer 216 is formed on the above-described planarized surface. The second etch stop layer 216 may control the end point during subsequent etching processes. In some embodiments, the second etch stop layer 216 is formed of silicon oxide, silicon nitride, silicon carbide, silicon oxynitride or combinations thereof. In some embodiments, the second etch stop layer 216 has a thickness of about 10 angstroms to about 1000 angstroms. In some embodiments, the second etch stop layer 216 is formed through any of a variety of deposition techniques, including LPCVD, APCVD, PECVD, PVD, and sputtering.

Figure 6:
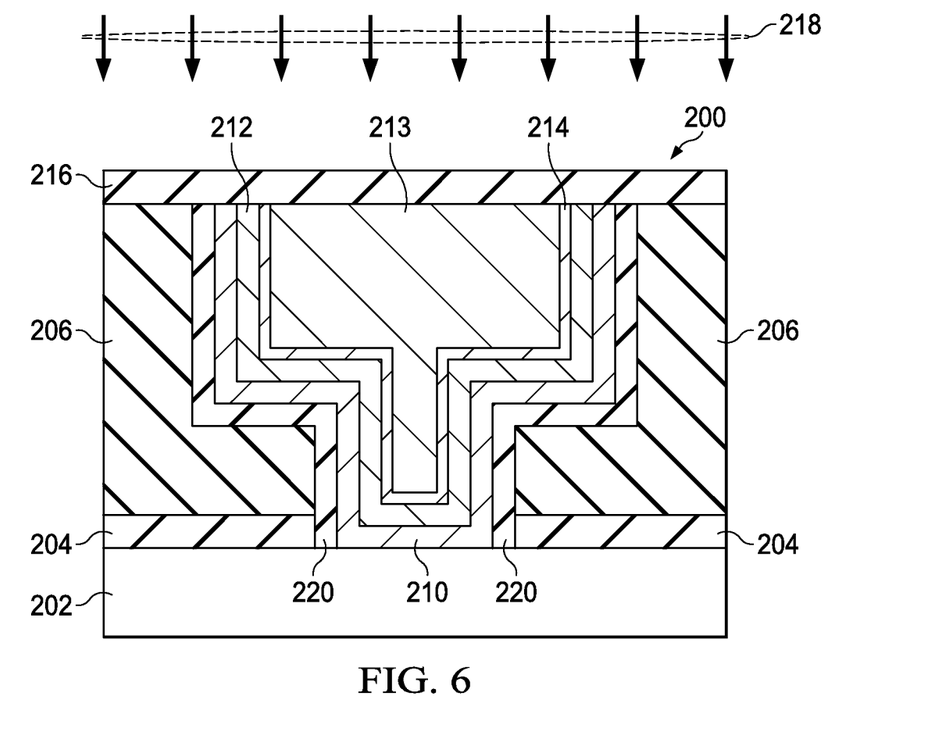

Referring to FIGS. 1 and 6, the method 100 proceeds to step 114 wherein a thermal treatment 218 is performed on the semiconductor substrate 202. In some embodiments, the thermal treatment 218 includes an annealing process. In one embodiment, the thermal treatment 218 is performed at a temperature ranged from about 137 degrees Celsius to about 600 degrees Celsius. In another embodiment, the thermal treatment 218 is performed at a temperature ranged from about 280 degrees Celsius to about 400 degrees Celsius. In one embodiment, the thermal treatment 218 is performed at a duration ranged from about 10 minutes to about 600 minutes. In some embodiments, the thermal treatment 218 is performed using a chemical vapor deposition (CVD) process, furnace, rapid thermal processing (RTP), hot plate equipment, or any of a variety of heat treatment techniques.

During and/or after the thermal process, in some embodiments, the additive metal element in the copper-containing layer 210 partially or completely diffuses to the surface of the dielectric layer 206. In some embodiments, the diffused additive metal element reacts with the dielectric layer 206 to form a diffusion barrier layer 220. The diffusion barrier layer 220 is formed in a self-aligned manner at the boundary between the dielectric layer 206 and the copper-containing layer 210. In one embodiment, the diffusion barrier layer 220 has a thickness ranging from about 1 angstrom to about 30 angstroms. In another embodiment, the diffusion barrier layer 220 has a thickness ranging from about 1 angstrom to about 15 angstroms. In some embodiments, the formation of the diffusion barrier layer 220 consumes some of the dielectric layer 206 and the copper-containing layer 210. In one embodiment, the diffusion barrier layer 220 is a metal oxide layer because the oxygen existed in the dielectric layer 206 reacts with the additive metal element in the copper-containing layer 210 during the heating treatment process. In some embodiments, the metal oxide layer is MnOx and/or MnSiyOz. In alternative embodiments, the metal oxide layer is TiOx, AlOx, CoOx, VOx, YOx, TcOx, ReOx, or combinations thereof. In some embodiments, the diffusion barrier layer 220 has a weight ratio of manganese to oxygen from about 0.1 to about 10. The diffusion barrier layer 220 may function as a protector to prevent the conductor 213 and/or the conductive seed layer 214 from diffusing into the dielectric layer 206.

The step of thermal treatment can be provided by any thermal processing after forming the copper-containing layer 210. In alternative embodiments, the step of thermal treatment is provided at the time immediately after the formation of the copper-containing layer 210, immediately after the step of CMP of removing the excess portions of the conductor 213 outside the recess cavity 208, immediately after the step of forming the second etch stop layer 216, or after the step of forming a passivation layer on a top metal layer.

Advantages of one or more embodiments of the present disclosure may include one or more of the following.

In one or more embodiments, the conformal protective layer includes Co or Ru having a low resistivity to decrease contact resistance and RC delay issues thereby improving device performance.

In one or more embodiments, as the protective layer is conformally deposited in a damascene opening, gap filling issues are avoided during the subsequent opening filling process.

In one or more embodiments, the diffusion barrier layer formed in a self-aligned manner can solve the contact issue to improve package capabilities.

In one or more embodiments, the conformal protective layer over the diffusion barrier layer may improve the interconnect conductor from diffusing into an IMD layer to ensure package capabilities.

Various aspects of the present disclosure have been described. According to one aspect of this description, a method of manufacturing a semiconductor device, includes forming a dielectric layer overlying a substrate, forming an opening in the dielectric layer, forming a metal-containing layer overlying the opening in the dielectric layer, forming a conformal protective layer overlying the metal-containing layer, filling a conductive layer in the opening, and performing a thermal process to form a metal oxide barrier layer underlying the metal-containing layer.

According to another aspect of this description, a method of manufacturing a semiconductor device, includes forming a dielectric layer overlying a substrate, forming an opening in the dielectric layer, forming a copper manganese (CuMn) layer overlying the opening in the dielectric layer, forming a conformal cobalt (Co) or ruthenium (Ru) layer overlying the CuMn layer, filling a conductive layer in the opening, performing a chemical mechanical polishing (CMP) process to remove the portions of conductive layer outside the opening, and performing a thermal process to form a MnOx barrier layer underlying the CuMn layer.

According to yet another aspect of this description, a semiconductor device includes a dielectric layer overlying a substrate, a conductive line with a sidewall in the dielectric layer, a conformal cobalt (Co) or ruthenium (Ru) layer adjoining the sidewall of the conductive line, and a metal oxide barrier layer formed between the conductive line and the dielectric layer.

In the preceding detailed description, various embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims and their range of equivalents.

What is claimed is:

1. A method, comprising:
   forming a first dielectric layer overlying a substrate;
   forming an opening in the first dielectric layer;
   forming a metal-containing layer overlying the opening in the first dielectric layer, the metal-containing layer comprising manganese (Mn);
   forming a conformal protective layer overlying the metal-containing layer;
   filling a conductive layer in the opening;
   forming a second dielectric layer overlying the conductive layer and the first dielectric layer; and
   after forming the second dielectric layer, performing a thermal process to begin forming a MnOx barrier layer underlying the metal-containing layer such that a bottommost surface of the MnOx barrier layer is substantially level with a bottommost surface of the metal-containing layer, the MnOx barrier layer having a weight ratio of manganese to oxygen from about 0.1 to about 10.

2. The method of claim 1, wherein the metal-containing layer is a copper-containing layer.

3. The method of claim 1, wherein the metal-containing layer comprising Mn is a CuMn layer.

4. The method of claim 3, wherein a ratio of manganese to copper in the CuMn layer ranges from about 0.02% to about 5%.

5. The method of claim 3, wherein the CuMn layer has a face center cubic (FCC) crystal structure.

6. The method of claim 1, wherein the metal-containing layer has a thickness ranging from about 20 Angstroms to about 200 Angstroms.

7. The method of claim 1, wherein the conformal protective layer is a cobalt (Co) layer, a ruthenium (Ru) layer, or combinations thereof.

8. The method of claim 7, wherein the conformal protective layer has a thickness ranging from about 10 Angstroms to about 50 Angstroms.

9. The method of claim 1, wherein the conformal protective layer is formed by chemical vapor deposition (CVD) or atomic layer deposition (ALD).

10. The method of claim 1, further comprising forming a seed layer in the opening prior to forming the conductive layer.

11. The method of claim 1, wherein the MnOx barrier layer is formed by reacting Mn in the metal-containing layer and oxygen in the first dielectric layer.

12. A method, comprising:
    forming a dielectric layer overlying a substrate;
    forming an opening in the dielectric layer;
    forming a copper manganese (CuMn) layer overlying the opening in the dielectric layer;
    forming a conformal cobalt (Co) or ruthenium (Ru) layer overlying the CuMn layer;
    filling a conductive layer in the opening;
    performing a chemical mechanical polishing (CMP) process to remove portions of the conductive layer outside the opening; and
    after performing the CMP process, performing a thermal process to form a MnOx barrier layer underlying the CuMn layer such that at least a portion of the CuMn layer contacts the substrate, the MnOx barrier layer having a weight ratio of manganese to oxygen from about 0.1 to about 10.

13. The method of claim 12, wherein the CuMn layer has a thickness ranging from about 20 Angstroms to about 200 Angstroms.

14. The method of claim 12, wherein a ratio of manganese to copper in the CuMn layer ranges from about 0.02% to about 5%.

15. The method of claim 12, wherein the conformal Co/Ru layer has a thickness ranging from about 10 Angstroms to about 50 Angstroms and is formed by chemical vapor deposition (CVD) or atomic layer deposition (ALD).

16. The method of claim 12, wherein the MnOx barrier layer is formed by reacting the Mn in the CuMn layer and oxygen in the dielectric layer.

17. The method of claim 12, wherein the CuMn layer has a face center cubic (FCC) crystal structure.

18. A method, comprising:
    forming a dielectric layer overlying a semiconductor substrate;
    patterning the dielectric layer to form a trench therein;
    lining the trench with a metal-containing layer, the metal-containing layer comprising an additive metal element;
    forming a conformal protective layer on the metal-containing layer;
    filling a conductive layer in the trench;
    removing portions of the conductive layer overfilling the trench; and
    forming an etch stop layer overlying the conductive layer and the dielectric layer; and
    after removing the portions of the conductive layer, heating the metal-containing layer to form a metal oxide barrier layer underlying the metal-containing layer such that the metal-containing layer directly contacts at least a portion of the semiconductor substrate, the metal oxide barrier layer comprising an oxide of the additive metal element.

19. The method of claim 18 wherein heating the metal-containing layer comprises performing an annealing process.

20. The method of claim 19 wherein the annealing process is performed at a temperature of from about 137 degrees Celsius to about 600 degrees Celsius.

* * * * *